US008802358B2

(12) United States Patent
Ou et al.

(10) Patent No.: US 8,802,358 B2
(45) Date of Patent: Aug. 12, 2014

(54) METHOD OF FORMING ALIGNMENT FILM

(71) Applicants: Innocom Technology(Shenzhen)Co., Ltd., Longhua Town (TW); Chimei Innolux Corporation, Miao-Li County (TW)

(72) Inventors: Yao-Jen Ou, Miao-Li County (TW); Han-Lang Lee, Miao-Li County (TW); Chien-Chih Wang, Miao-Li County (TW); Hung-I Tseng, Miao-Li County (TW)

(73) Assignees: Innocom Technology (Shenzhen) Co., Ltd., Longhua Town, Shenzhen (CN); Innolux Corporation, Miao-Li County (TW)

( * ) Notice: Subject to any disclaimer, the term of this patent is extended or adjusted under 35 U.S.C. 154(b) by 95 days.

(21) Appl. No.: 13/669,659

(22) Filed: Nov. 6, 2012

(65) Prior Publication Data
US 2013/0130181 A1    May 23, 2013

(30) Foreign Application Priority Data

Nov. 23, 2011  (TW) .............................. 100142990 A

(51) Int. Cl.
*G03F 7/20* (2006.01)
(52) U.S. Cl.
USPC ............................ 430/320; 430/321; 430/394
(58) Field of Classification Search
None
See application file for complete search history.

(56) References Cited

U.S. PATENT DOCUMENTS

| 8,427,611 | B2 | 4/2013 | Hakoi et al. | |
|---|---|---|---|---|
| 2009/0279044 | A1* | 11/2009 | Hakoi et al. | 349/187 |
| 2010/0035190 | A1* | 2/2010 | Jung et al. | 430/322 |
| 2013/0100431 | A1* | 4/2013 | Kajiyama et al. | 355/72 |

FOREIGN PATENT DOCUMENTS

| TW | 201137474 A | 11/2011 |
|---|---|---|
| WO | 2010137402 A1 | 12/2010 |
| WO | WO 2011/132620 A1 * | 10/2011 |

* cited by examiner

*Primary Examiner* — John A. McPherson
(74) *Attorney, Agent, or Firm* — McClure, Qualey & Rodack, LLP

(57) ABSTRACT

A method of forming an alignment film is provided. A photosensitive polymer material is provided, wherein the photosensitive polymer material defines a first pixel area and a second pixel area respectively defining a first sub-pixel area and the second sub-pixel area. In a first exposure, the photosensitive polymer material is irradiate by a first exposure light and a second exposure light to form a first alignment portion and a second alignment portion with different alignment directions in the first sub-pixel of the first pixel area and the second sub-pixel of the second pixel area respectively. In a second exposure, the photosensitive polymer material is irradiated with the first exposure light and the second exposure light to form a third alignment portion and a fourth alignment portion with different alignment directions in the first sub-pixel of the second pixel area and the second sub-pixel of the first pixel area respectively.

12 Claims, 9 Drawing Sheets

METHOD OF FORMING ALIGNMENT FILM

This application claims the benefit of Taiwan application Serial No. 100142990, filed Nov. 23, 2011, the subject matter of which is incorporated herein by reference.

BACKGROUND OF THE INVENTION

1. Field of the Invention

The invention relates in general to a method of forming an alignment film, and more particularly to a method of forming an alignment film by way of exposure.

2. Description of the Related Art

Conventionally, the formation of alignment film includes a dispensing process, a baking process, an aligning process and a cleaning process. Firstly, polyimide (PI) is dispensed on two substrates respectively and used as a material of the alignment film. Then, the substrates are baked in a firing furnace for thermosetting the alignment film. Then, an alignment apparatus (such as rollers) is used to form recesses in a predetermined direction on the thermoset alignment film by way of rubbing. Lastly, the two substrates are cleaned with a cleaning apparatus. Thus, recesses and angle are formed on the alignment film in a particular direction, so that liquid crystal molecules can be arranged in order. After the two substrates both form an alignment film, subsequent procedures of panel fabrication are performed for aligning and bonding the two substrates and interposing liquid crystal molecules to the recesses.

According to the generally known technique, the alignment film is formed in a contact manner, that is, recesses are formed by rubbing the alignment film. Since the powders or scraps left after the rubbing process need to be cleaned up with a cleaning apparatus, additional manufacturing procedures and costs are required. In addition, the rubbing process may generate unexpected recesses or scratches and reduce the conformity rate, and the static electricity generated during the rubbing process may damage the circuits on the substrates. Besides, the alignment apparatus boosts the production cost.

SUMMARY OF THE INVENTION

The invention is directed to an alignment film formation method capable of simplifying manufacturing procedures and reducing production cost.

According to one embodiment of the present invention, a method of forming an alignment film is provided. The method comprises the following steps. Firstly, a photosensitive polymer material is provided, wherein the photosensitive polymer material defines a first pixel area and a second pixel area respectively defining a first sub-pixel area and the second sub-pixel area. Then, in a first exposure, the photosensitive polymer material is irradiate by a first exposure light and a second exposure light to form a first alignment portion and a second alignment portion in the first sub-pixel area of the first pixel area and the second sub-pixel area of the second pixel area respectively, wherein the alignment direction of the first alignment portion is different from that of the second alignment portion. Then, in a second exposure, the photosensitive polymer material is irradiated with the first exposure light and the second exposure light to form a third alignment portion and a fourth alignment portion in the second sub-pixel area of the first pixel area and the first sub-pixel area of the second pixel area respectively, wherein the alignment direction of the third alignment portion is different from that of the fourth alignment portion.

According to another embodiment of the present invention, a method of forming an alignment film is provided. The method comprises the following steps. A photosensitive polymer material is provided, wherein the photosensitive polymer material defines N×M pixel areas each defining N×M sub-pixel areas. In each of the N×M times of exposure, the photosensitive polymer material is irradiated with M different exposure lights to form a plurality of alignment portions with different alignment directions in one sub-pixel area of each of the N×M pixel areas, wherein, N denotes the number of polarization orientation of each of the M exposure lights.

The above and other aspects of the invention will become better understood with regard to the following detailed description of the preferred but non-limiting embodiment(s). The following description is made with reference to the accompanying drawings.

DETAILED DESCRIPTION OF THE INVENTION

In an embodiment of the invention, a photosensitive polymer material is provided, wherein the photosensitive polymer material defines N×M pixel areas each defining N×M sub-pixel areas. In each of the N×M times of exposure, the photosensitive polymer material is irradiated with M different exposure lights so as to form N×M alignment portions with different alignment directions in one sub-pixel area of each of the N×M pixel areas, wherein, N denotes the number of polarization orientation of each of the M exposure lights. Thus, after N×M times of exposure, N×M alignment portions with different alignment directions are formed in the N×M sub-pixel areas of each of the N×M pixel areas respectively. Detailed descriptions are given below.

Referring to FIGS. 1~4B, procedures of forming an alignment film according to an embodiment of the invention are shown. Let M=2 and N=1 be used as an exemplification.

Figure 1:
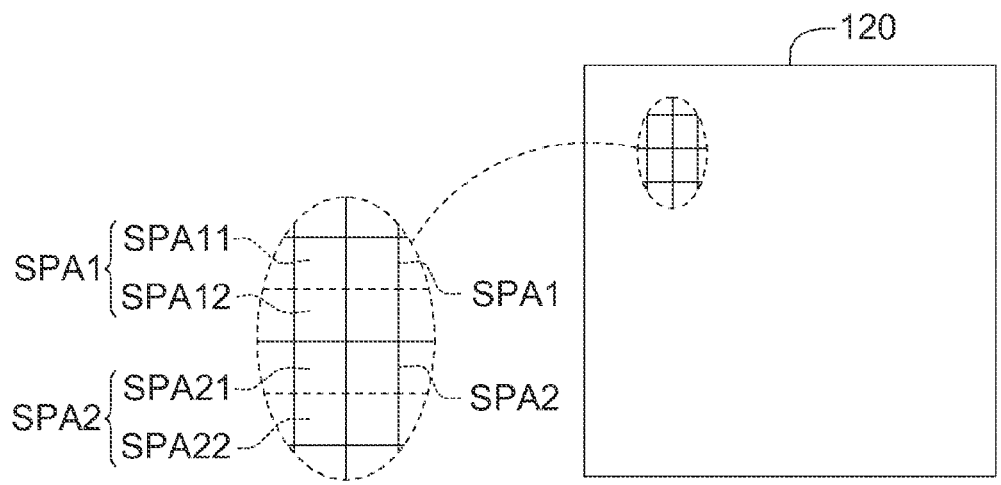
FIGS. 1, 2 and 3A~4B are procedures of forming an alignment film according to an embodiment of the invention.

As illustrated in FIG. 1, a photosensitive polymer material 120 is provided, wherein the photosensitive polymer material 120 defines a plurality of pixel areas. Let two pixel areas (N×M=2) be used as an exemplification. The two pixel areas are a first pixel area SPA1 and a second pixel area SPA2. Each of the first pixel area SPA1 and the second pixel area SPA2 defines two sub-pixel areas (N×M=2). For example, the first pixel area SPA1 defines a first sub-pixel area SPA11 and a second sub-pixel area SPA12, and the second pixel area SPA2 defines a first sub-pixel area SPA21 and a second sub-pixel area SPA22.

At least one of the first pixel areas SPA1 and/or at least one of the second pixel areas SPA2 may correspond to one single pixel area of a liquid crystal display (not illustrated). In the present embodiment of the invention, the first pixel area SPA1 and the second pixel area SPA2 respectively correspond to two pixel areas of a liquid crystal display. In another embodiment, the single first pixel area SPA1 and the single second pixel area SPA2 may both correspond to one single pixel area of the liquid crystal display. In other embodiment, plural first pixel areas SPA1 and plural second pixel areas SPA2 may all correspond to one single pixel area of the liquid crystal display.

Figure 2:
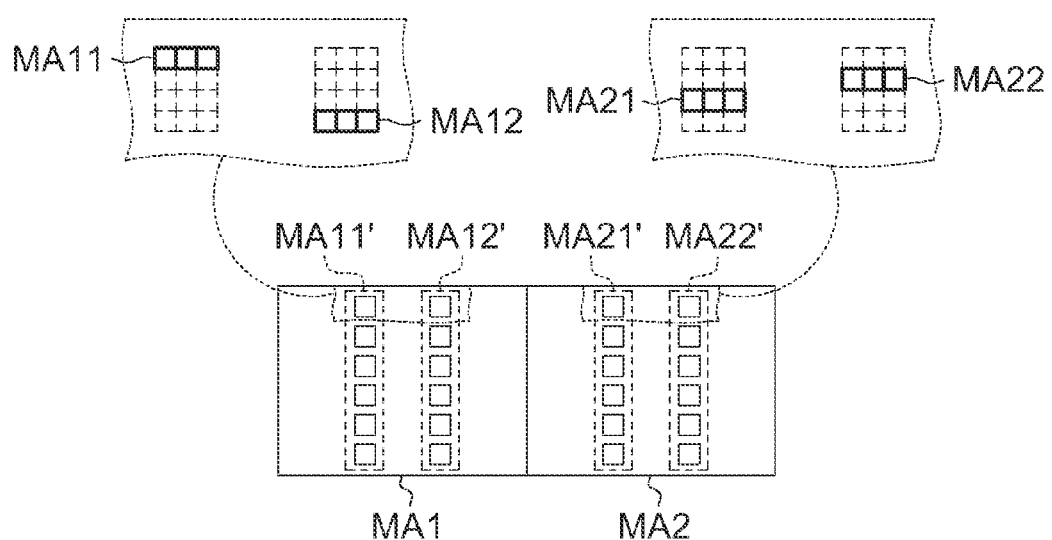

As illustrated in FIG. 2, a top view of a mask for forming an alignment film according to an embodiment of the invention is shown.

Two masks (N×M=2) are provided, wherein the two masks, namely, a first mask MA1 and a second mask MA2, may be adjacent to each other.

Each of the first mask MA1 and the second mask MA2 has two exposure units (M=2). For example, the first mask MA1 has a first exposure unit MA11 and a second exposure unit MA12; the second mask MA2 has a first exposure unit MA21 and a second exposure unit MA22.

Each mask may have at least one first exposure unit and at least one second exposure unit. When the quantity of exposure units is plural, the plural exposure units form a row of exposure units. Let the first exposure unit MA11 be used as an exemplification. A plurality of first exposure units MA11 forms a first row of exposure units as illustrated in a strip demarcated by dotted lines MA11' of FIG. 2. Other exposure units have similar features, and the similarities are not repeated here.

As illustrated in the enlargements of FIG. 2, the first exposure unit MA11 and the second exposure unit MA12 refer to the transparent areas (illustrated in bold lines) on the mask.

To avoid the diagram being too complicated, FIG. 2 does not illustrate every distribution area of the first exposure unit MA11 (illustrated in bold lines) but uses the six sub-exposure areas within the strip demarcated by dotted lines MA11' to denote all distribution areas of the first exposure unit MA11. It is to be understood that the present embodiment of the invention is not restricted by the exemplification of six sub-exposure areas. Similarly, FIG. 2 does not illustrate every distribution area of the second exposure unit MA12 (illustrated in bold lines) but uses the six sub-exposure areas within the strip demarcated by dotted lines MA12' to denote all distribution areas of the second exposure unit MA12.

Figure 3A:
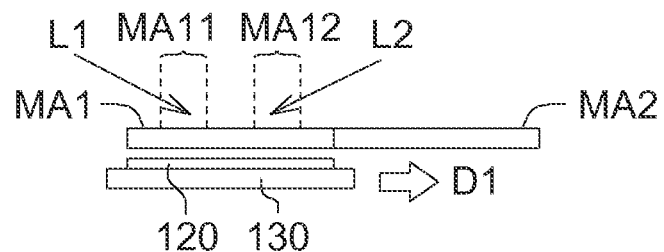

As illustrated in FIG. 2, the first exposure unit MA11 and the second exposure unit MA12 of the first mask MA1 are separated by a distance along a moving direction D1 (the moving direction D1 illustrated in FIG. 3A is such as the leftward/rightward directions of FIG. 2). In another embodiment, the first exposure unit MA11 and the second exposure unit MA12 of the first mask MA1 are separated by a distance along a direction perpendicular to the moving direction D1 (such as the upward/downward directions of FIG. 2).

In the present embodiment of the invention, the area of the first exposure unit MA11 of the first mask MA1 corresponds to the first sub-pixel area SPA11 of the first pixel area SPA1, and the area of the second exposure unit MA12 corresponds to the second sub-pixel area SPA22 of the second pixel area SPA2, so that the light may pass through the first exposure unit MA11 to irradiate the first sub-pixel area SPA11 of the first pixel area SPA1 and pass through the second exposure unit MA12 to irradiate the second sub-pixel area SPA22 of the second pixel area SPA2.

As illustrated in FIG. 2, the first exposure unit MA21 and the second exposure unit MA22 of the second mask MA2 are separated by a distance along a moving direction D1. In another embodiment, the first exposure unit MA21 and the second exposure unit MA22 of the second mask MA2 are separated by a distance along a direction perpendicular to the moving direction D1 (such as the upward/downward directions of FIG. 2).

The first exposure unit MA21 and the second exposure unit MA22 refer to the transparent areas (illustrated in bold lines) on the mask. To avoid the diagram being too complicated, FIG. 2 does not illustrate every distribution area of the first exposure unit MA21 (illustrated in bold lines) but uses the six sub-exposure areas within the strip demarcated by dotted lines MA21' to denote all distribution areas of the first exposure unit MA21. It is to be understood that the present embodiment of the invention is not restricted by the exemplification of six sub-exposure areas. Similarly, FIG. 2 does not illustrate every distribution area of the second exposure unit MA22 (illustrated in bold lines) but uses the six sub-exposure areas within the strip demarcated by dotted lines MA22' to denote all distribution areas of the second exposure unit MA22.

In addition, the area of the first exposure unit MA21 of the second mask MA2 corresponds to the first sub-pixel area SPA21 of the second pixel area SPA2, and the area of the second exposure unit MA22 corresponds to the second sub-pixel area SPA12 of the first pixel area SPA1, so that the light may pass through the first exposure unit MA21 to irradiate the first sub-pixel area SPA21 of the second pixel area SPA2 and pass through the second exposure unit MA22 to irradiate the second sub-pixel area SPA12 of the first pixel area SPA1.

Then, after the photosensitive polymer material 120 is disposed on the substrate 130, the substrate 130 is driven by a moving platform (not illustrated) to sequentially pass through the first mask MA1 and the second mask MA2. Detailed descriptions are given below.

Figure 3B:
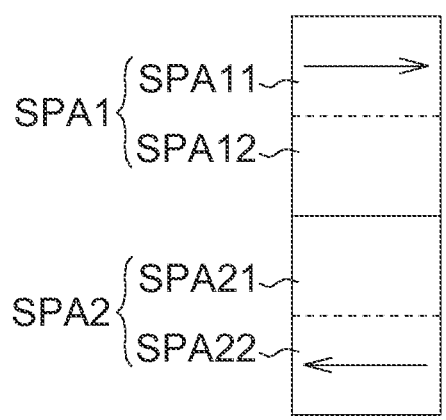

As illustrated in FIG. 3A, in a first exposure, in the course when the photosensitive polymer material 120 sequentially passes through the first exposure unit MA11 and the second exposure unit MA12 of the first mask MA1, the photosensitive polymer material 120 is irradiated with a first exposure light L1 and a second exposure light L2 (M=2 exposure directions) respectively passing through the first exposure unit MA11 and the second exposure unit MA12 to form a plurality of alignment portions with different alignment directions in one sub-pixel area of each of the first pixel area SPA1 and the second pixel area SPA2. Furthermore, since the area of the first exposure unit MA11 corresponds to the first sub-pixel area SPA11 of the first pixel area SPA1, in the course when the photosensitive polymer material 120 passes through the first exposure unit MA11 of the first mask MA1, as illustrated in FIG. 3B, the first sub-pixel area SPA11 of the first pixel area SPA1 forms a first alignment portion (the alignment direction is illustrated by an arrow sign of FIG. 3B). For convenience of elaboration, FIG. 3B illustrates only one first pixel area SPA1 and one second pixel area SPA2. Furthermore, since the area of the second exposure unit MA12 corresponds to the second sub-pixel area SPA22 of the second pixel area SPA2, in the course when the photosensitive polymer material 120 passes through the second exposure unit MA12 of the first mask MA1, as illustrated in FIG. 3B, the second sub-pixel area SPA22 of the second pixel area SPA2 forms a second alignment portion (the alignment direction is illustrated by an arrow sign of FIG. 3B). The alignment direction of the first alignment portion is different from that of the second alignment portion. In the present embodiment of the invention, the alignment direction of the first alignment portion and that of the second alignment portion are differentiated by 180°.

As illustrated in FIG. 3A, since the first exposure unit MA11 and the second exposure unit MA12 of the first mask MA1 are separated by a distance along a moving direction D1, the first exposure light L1 does not irradiate the second exposure unit MA12. Similarly, the second exposure light L2 does not irradiate the first exposure unit MA11 either.

Figure 4A:
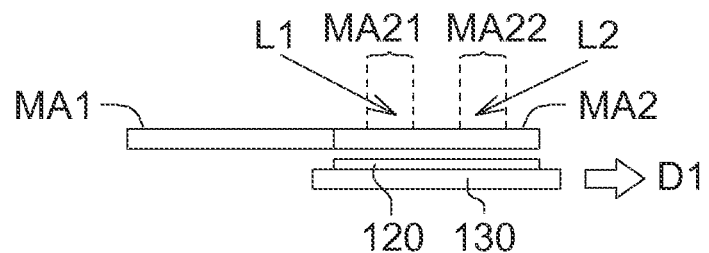
Figure 4B:
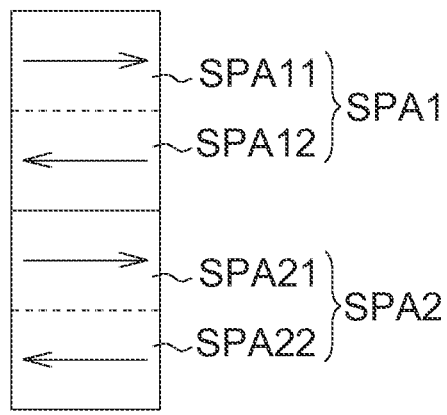

As illustrated in FIG. 4A, in a second exposure, in the course when the photosensitive polymer material 120 sequentially passes through the first exposure unit MA21 and the second exposure unit MA22 of the second mask MA2, the photosensitive polymer material 120 is irradiated with the first exposure light L1 and the second exposure light L2 respectively passing through the first exposure unit MA21 and the second exposure unit MA22 to form a plurality of alignment portions with different alignment directions in one sub-pixel area of each of the first pixel area SPA1 and the second pixel area SPA2. Furthermore, since the area of the first exposure unit MA21 corresponds to the first sub-pixel area SPA21 of the second pixel area SPA2, in the course when the photosensitive polymer material 120 passes through the first exposure unit MA21, as illustrated in FIG. 4B, the first sub-pixel area SPA21 of the second pixel area SPA2 forms a third alignment portion (the alignment direction is illustrated by an arrow sign of FIG. 4B). Since the area of the second exposure unit MA22 corresponds to the second sub-pixel area SPA12 of the first pixel area SPA1, in the course when the photosensitive polymer material 120 passes through the second exposure unit MA22, as illustrated in FIG. 4B, the second sub-pixel area SPA12 of the first pixel area SPA1 forms a fourth alignment portion (the alignment direction is illustrated by an arrow sign of FIG. 4B). The alignment direction of the third alignment portion is different from that of the fourth alignment portion. In the present embodiment of the invention, the alignment direction of the third alignment portion and that of the fourth alignment portion are differentiated by 180°.

As illustrated in FIG. 4A, since the first exposure unit MA21 and the second exposure unit MA22 of the second mask MA2 are separated by a distance along a moving direction D1, the first exposure light L1 does not irradiate the second exposure unit MA22, and the second exposure light L2 does not irradiate the first exposure unit MA21 either.

In the above embodiments, N=1 and M=2 are used as an exemplification. In each exposure, a sub-pixel area (an alignment portion is not yet formed thereon) of the first pixel area SPA1 and a sub-pixel area (an alignment portion is not yet formed thereon) of the second pixel area SPA2 form alignment portions with different alignment directions. Thus, after two times of exposure (N×M=2), all sub-pixel areas of each pixel area form different alignment portions with different alignment directions. Thus, each pixel area of the photosensitive polymer material 120 makes the display panel using the same become a display panel with multi-dimensional display domain.

In the disclosed embodiments, the photosensitive polymer material 120 sequentially passes through the first mask MA1 and the second mask MA2. In another embodiment, the photosensitive polymer material 120 may sequentially pass through the second mask MA2 and the first mask MA1.

In the course of driving the photosensitive polymer material 120 to pass through the first mask MA1 and the second mask MA2, the photosensitive polymer material 120 may be moved horizontally. That is, in the present embodiment of the invention, the alignment operation of the substrate 130 may be completed without rotating the photosensitive polymer material 120.

Referring to FIGS. 5~10B, procedures of forming an alignment film according to the invention another embodiment are shown. Let M=2 and N=2 be used as an exemplification.

Figure 5:
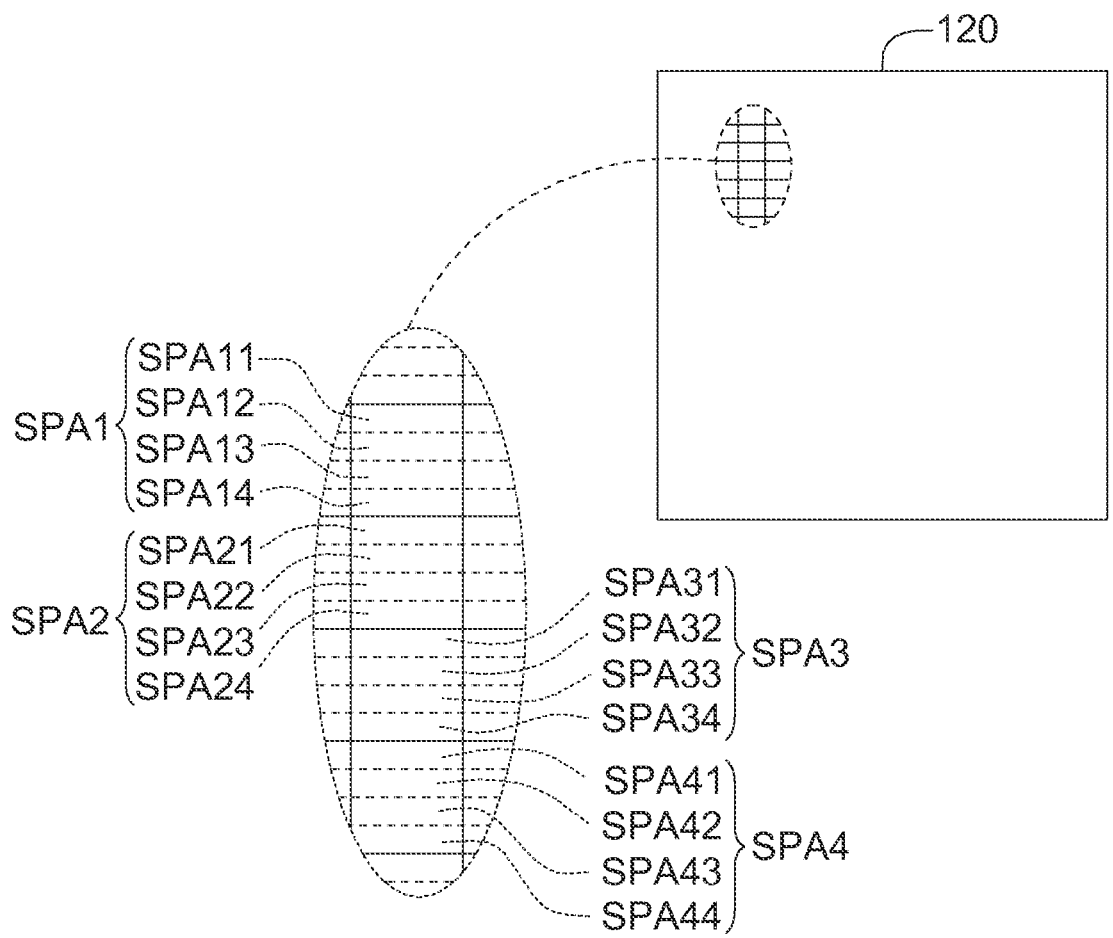
FIGS. 5, 6 and 7A~10B are procedures of forming an alignment film according to another embodiment of the invention.

As illustrated in FIG. 5, a photosensitive polymer material 120 is provided, wherein the photosensitive polymer material 120 defines a plurality of pixel areas. In the following elaboration, four pixel areas (N×M=4) are used as an exemplification. The four pixel areas respectively are a first pixel area SPA1, a second pixel area SPA2, a third pixel area SPA3 and a fourth pixel area SPA4. Each of the first pixel area SPA1, the second pixel area SPA2, the third pixel area SPA3 and the fourth pixel area SPA4 defines four sub-pixel areas (N×M=4). For example, the first pixel area SPA1 defines a first sub-pixel area SPA11, a second sub-pixel area SPA12, a third sub-pixel area SPA13 and a fourth sub-pixel area SPA14. The second pixel area SPA2 defines a first sub-pixel area SPA21, a second sub-pixel area SPA22, a third sub-pixel area SPA23 and a fourth sub-pixel area SPA24. The third pixel area SPA3 defines a first sub-pixel area SPA31, a second sub-pixel area SPA32, a third sub-pixel area SPA33 and a fourth sub-pixel area SPA34. The fourth pixel area SPA4 defines a first sub-pixel area SPA41, a second sub-pixel area SPA42, a third sub-pixel area SPA43 and a fourth sub-pixel area SPA44.

At least one of the first pixel area SPA1, at least one of the second pixel area SPA2, at least one of the third pixel area SPA3 and/or at least one of the fourth pixel area SPA4 may correspond to one single pixel area of a liquid crystal display (not illustrated). In the present embodiment of the invention, the first pixel area SPA1, the second pixel area SPA2, the third pixel area SPA3 and the fourth pixel area SPA4 respectively correspond to four pixel areas of a liquid crystal display. For example, the single first pixel area SPA1, the single second pixel area SPA2, the single third pixel area SPA3 and the single fourth pixel area SPA4 may all correspond to one single pixel area of a liquid crystal display. For example, plural first pixel areas SPA1, plural second pixel areas SPA2, plural third pixel areas SPA3 and plural fourth pixel areas SPA4 may all correspond to one single pixel area of a liquid crystal display.

Figure 6:
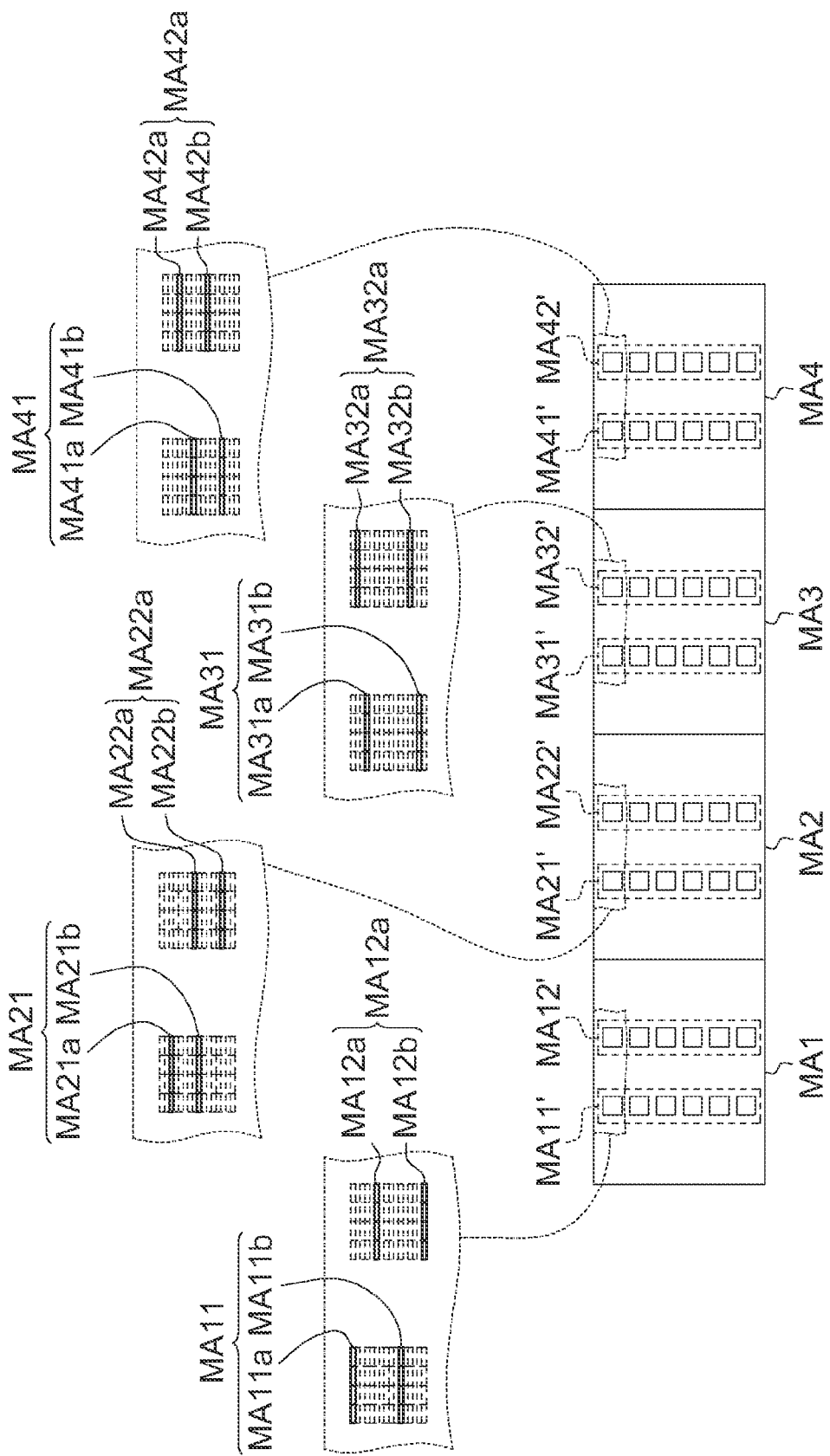

As illustrated in FIG. 6, a top view of a mask for forming an alignment film according to another embodiment of the invention is shown. Four masks (N×M) are provided, wherein the four masks, namely a first mask MA1, a second mask MA2, a third mask MA3 and a fourth mask MA4, may be adjacent to each other.

Each of the first mask MA1, the second mask MA2, the third mask MA3 and the fourth mask MA4 has two exposure units (M=2). For example, the first mask MA1 has a first exposure unit MA11 and a second exposure unit MA12. The second mask MA2 has a first exposure unit MA21 and a second exposure unit MA21. The third mask MA3 has a first exposure unit MA31 and a second exposure unit MA32. The fourth mask MA4 has a first exposure unit MA41 and a second exposure unit MA42.

The above exposure units refer to the transparent areas on the mask. To avoid the diagram being too complicated, FIG. 6 does not illustrate every distribution area of the first exposure unit MA11 (illustrated in bold lines) but uses the six sub-exposure areas within the strip demarcated by dotted lines MA11' to denote all distribution areas of the first exposure unit MA11. It is to be understood that the present embodiment of the invention is not restricted by the exemplification of six sub-exposure areas. Similarly, the strips demarcated by dotted lines MA12', MA21', MA22', MA31', MA32', MA41' and MA42' of FIG. 6 have similar denotations, and the similarities are not repeated here.

Figure 7A:
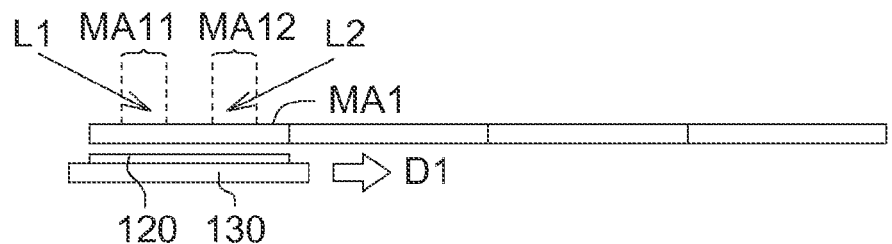

As illustrated in FIG. 6, the first exposure unit MA11 and the second exposure unit MA12 of the first mask MA1 are separated by a distance along moving direction D1 (the moving direction D1 illustrated in FIG. 7A is such as the leftward/rightward directions of FIG. 6). In another embodiment, the first exposure unit MA11 and the second exposure unit MA12 of the first mask MA1 are separated by a distance along a direction perpendicular to the moving direction D1 (such as the upward/downward directions of FIG. 6).

In the present embodiment of the invention, the first exposure unit MA11 of the first mask MA1 has a first exposure sub-unit MA11a and a second exposure sub-unit MA11b, wherein the area of the first exposure sub-unit MA11a corresponds to the first sub-pixel area SPA11 of the first pixel area SPA1, and the area of the second exposure sub-unit MA11b corresponds to the third sub-pixel area SPA33 of the third pixel area SPA3. The second exposure unit MA12 has a first exposure sub-unit MA12a and a second exposure sub-unit MA12b, wherein the area of the first exposure sub-unit MA12a corresponds to the second sub-pixel area SPA22 of the second pixel area SPA2, and the second exposure sub-unit MA12b corresponds to the fourth sub-pixel area SPA44 of the fourth pixel area SPA4. Thus, the light may pass through the first exposure unit MA11 to irradiate the first sub-pixel area SPA11 of the first pixel area SPA1 and the third sub-pixel area SPA33 of the third pixel area SPA3 and pass through the second exposure unit MA12 to irradiate the second sub-pixel area SPA22 of the second pixel area SPA2 and the fourth sub-pixel area SPA44 of the fourth pixel area SPA4.

As illustrated in FIG. 6, the first exposure unit MA21 and the second exposure unit MA22 of the second mask MA2 are separated by a distance along a moving direction D1. In another embodiment, the first exposure unit MA21 and the second exposure unit MA22 of the second mask MA2 are separated by a distance along a direction perpendicular to the moving direction D1.

In the present embodiment of the invention, the first exposure unit MA21 of the second mask MA2 has a first exposure sub-unit MA21a and a second exposure sub-unit MA21b, wherein the area of the first exposure sub-unit MA21a corresponds to the third sub-pixel area SPA13 of the first pixel area SPA1, and the area of the second exposure sub-unit MA21b corresponds to the first sub-pixel area SPA31 of the third pixel area SPA3. The second exposure unit MA22 has a first exposure sub-unit MA22a and a second exposure sub-unit MA22b, wherein the area of the first exposure sub-unit MA22a corresponds to the fourth sub-pixel area SPA24 of the second pixel area SPA2, and the second exposure sub-unit MA22b corresponds to the second sub-pixel area SPA42 of the fourth pixel area SPA4. Thus, the light may pass through the first exposure unit MA21 to irradiate the third sub-pixel area SPA13 of the first pixel area SPA1 and the first sub-pixel area SPA31 of the third pixel area SPA3 and pass through the second exposure unit MA12 to irradiate the fourth sub-pixel area SPA24 of the second pixel area SPA2 and the second sub-pixel area SPA42 of the fourth pixel area SPA4.

As illustrated in FIG. 6, the first exposure unit MA31 and the second exposure unit MA32 of the third mask MA3 are separated by a distance along a moving direction D1. In another embodiment, the first exposure unit MA31 and the second exposure unit MA32 of the third mask MA3 are separated by a distance along a direction perpendicular to the moving direction D1.

In the present embodiment of the invention, the first exposure unit MA31 of the third mask MA3 has a first exposure sub-unit MA31a and a second exposure sub-unit MA31b, wherein the area of the first exposure sub-unit MA31 a corresponds to the fourth sub-pixel area SPA24 of the second pixel area SPA2, and the area of the second exposure sub-unit MA31b corresponds to the third sub-pixel area SPA43 of the fourth pixel area SPA4. The second exposure unit MA32 has a first exposure sub-unit MA32a and a second exposure sub-unit MA32b, wherein the area of the first exposure sub-unit MA32a corresponds to the second sub-pixel area SPA12 of the first pixel area SPA1, and the second exposure sub-unit MA32b corresponds to the fourth sub-pixel area SPA34 of the third pixel area SPA3. Thus, the light may pass through the first exposure unit MA31 to irradiate the fourth sub-pixel area SPA24 of the second pixel area SPA2 and the third sub-pixel area SPA43 of the fourth pixel area SPA4 and pass through the second exposure unit MA32 to irradiate the second sub-pixel area SPA12 of the first pixel area SPA1 and the fourth sub-pixel area SPA34 of the third pixel area SPA3.

As illustrated in FIG. 6, the first exposure unit MA41 and the second exposure unit MA42 of the fourth mask MA4 are separated by a distance along a moving direction D1. In another embodiment, the first exposure unit MA41 and the second exposure unit MA42 of the fourth mask MA4 are separated by a distance along a direction perpendicular to the moving direction D1.

In the present embodiment of the invention, the first exposure unit MA41 of the fourth mask MA4 has a first exposure sub-unit MA41a and a second exposure sub-unit MA41b, wherein the area of the first exposure sub-unit MA41a corresponds to the third sub-pixel area SPA23 of the second pixel area SPA2, and the area of the second exposure sub-unit MA41b corresponds to the first sub-pixel area SPA41 of the fourth pixel area SPA4. The second exposure unit MA42 has a first exposure sub-unit MA42a and a second exposure sub-unit MA42b, wherein the area of the first exposure sub-unit MA42a corresponds to the fourth sub-pixel area SPA14 of the first pixel area SPA1, and the second exposure sub-unit MA42b corresponds to the second sub-pixel area SPA32 of the third pixel area SPA3. Thus, the light may pass through the first exposure unit MA41 to irradiate the third sub-pixel area SPA23 of the second pixel area SPA2 and the first sub-pixel area SPA41 of the fourth pixel area SPA4 and pass through the second exposure unit MA32 to irradiate the fourth sub-pixel area SPA14 of the first pixel area SPA1 and the second sub-pixel area SPA32 of the third pixel area SPA3.

Then, the photosensitive polymer material 120 is driven to move along moving direction D1, and sequentially pass through the first mask MA1, the second mask MA2, the third mask MA3 and the fourth mask MA4. Detailed descriptions are given below.

Figure 7B:
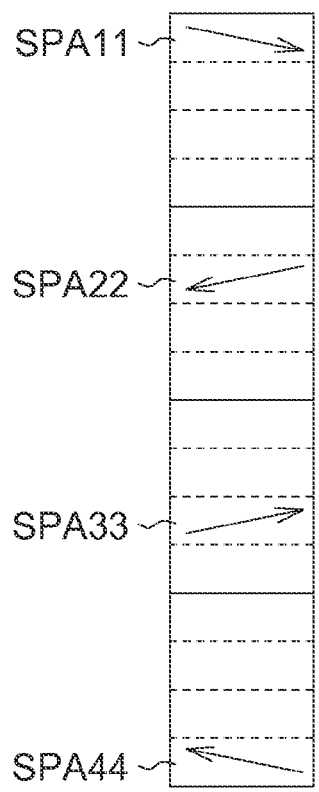

As illustrated in FIG. 7A, in a first exposure, in the course when the photosensitive polymer material 120 sequentially passes through the first exposure unit MA11 and the second exposure unit MA12 of the first mask MA1, the photosensitive polymer material 120 is irradiated with a first exposure light L1 and a second exposure light L2 respectively passing through the first exposure unit MA11 (FIG. 7B) and the second exposure unit MA12 (FIG. 7B) to form a plurality of alignment portions with different alignment directions in one single sub-pixel area (an alignment portion is not yet formed thereon) of each of the first pixel area SPA1, the second pixel area SPA2, the third pixel area SPA3 and the fourth pixel area SPA4. In the present embodiment of the invention, with the use of a polarizer (not illustrated), the first exposure light L1 forms two lights with different polarization directions through the relative disposition between the polarizer and the substrate. The two lights irradiate the first exposure sub-unit MA11a and the second exposure sub-unit MA11b of the first exposure unit MA11 to form two alignment portions with different alignment directions in the first sub-pixel area SPA11 of the first pixel area SPA1 and the third sub-pixel area SPA33 of the third pixel area SPA3 as illustrated in FIG. 7B. Similarly, with the use of a polarizer (not illustrated), the second exposure light L2 forms two lights with different polarization directions through the relative disposition between the polarizer and the substrate. The two lights irradiate the first exposure sub-unit MA21a and the second exposure sub-unit MA21b of the second exposure unit MA12 to form two alignment portions with different alignment directions in the second sub-pixel area SPA22 of the second pixel area SPA2 and the fourth sub-pixel area SPA44 of the fourth pixel area SPA4 as illustrated in FIG. 7B. In the present embodiment of the invention, the alignment portions formed in the first sub-pixel area SPA11, the third sub-pixel area SPA33, the second sub-pixel area SPA22 and the fourth sub-pixel area SPA44 have different alignment directions.

Figure 8A:
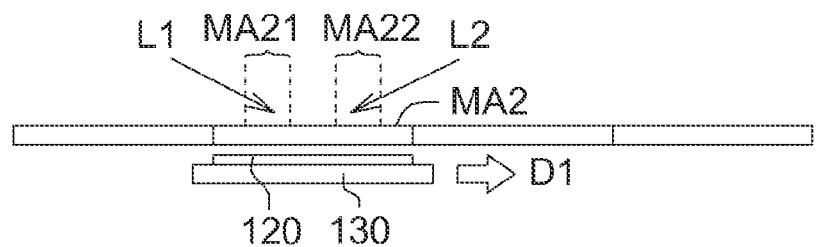
Figure 8B:
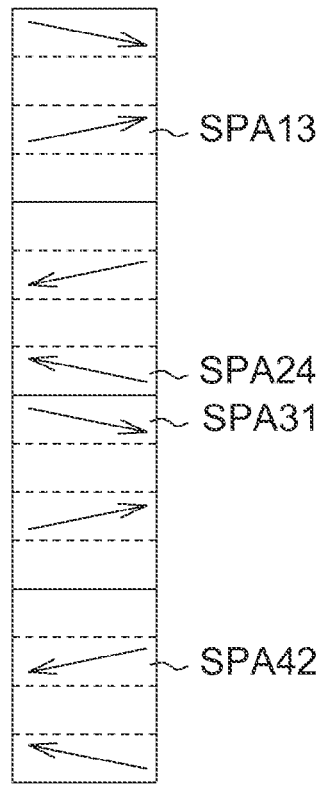

As illustrated in FIG. 8A, in a second exposure, in the course when the photosensitive polymer material 120 sequentially passes through the first exposure unit MA21 and the second exposure unit MA22 of the second mask MA2, the photosensitive polymer material 120 is irradiated with a first exposure light L1 and a second exposure light L2 respectively passing through the first exposure unit MA21 (FIG. 8B) and the second exposure unit MA22 (FIG. 8B) to form a plurality of alignment portions with different alignment directions in one single sub-pixel area (an alignment portion is not yet formed thereon) of each of the first pixel area SPA1, the second pixel area SPA2, the third pixel area SPA3 and the fourth pixel area SPA4. In the present embodiment of the invention, with the use of a polarizer (not illustrated), the first exposure light L1 forms two lights with different polarization directions through the relative disposition between the polarizer and the substrate. The two lights respectively irradiate the first exposure sub-unit MA21$a$ and the second exposure sub-unit MA21$b$ of the first exposure unit MA21 to form two alignment portions with different alignment directions in the third sub-pixel area SPA13 of the first pixel area SPA1 and the first sub-pixel area SPA31 of the third pixel area SPA3 as illustrated in FIG. 8B. Similarly, with the use of a polarizer (not illustrated), the second exposure light L2 forms two lights with different polarization directions. The two lights respectively irradiate the first exposure sub-unit MA22$a$ and the second exposure sub-unit MA22$b$ of the second exposure unit MA22 to form two alignment portions with different alignment directions in the fourth sub-pixel area SPA24 of the second pixel area SPA2 and the second sub-pixel area SPA42 of the fourth pixel area SPA4 as illustrated in FIG. 8B. In the present embodiment of the invention, the alignment portions formed in the third sub-pixel area SPA13, the first sub-pixel area SPA31, the fourth sub-pixel area SPA24 and the second sub-pixel area SPA42 have different alignment directions.

Figure 9A:
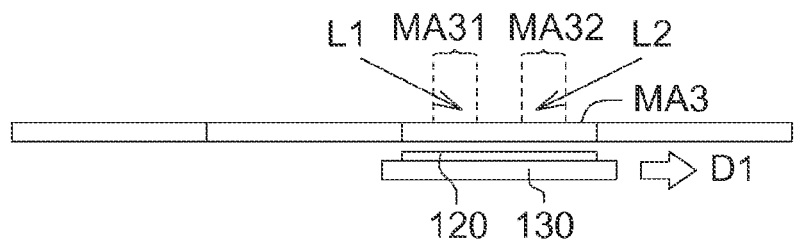
Figure 9B:
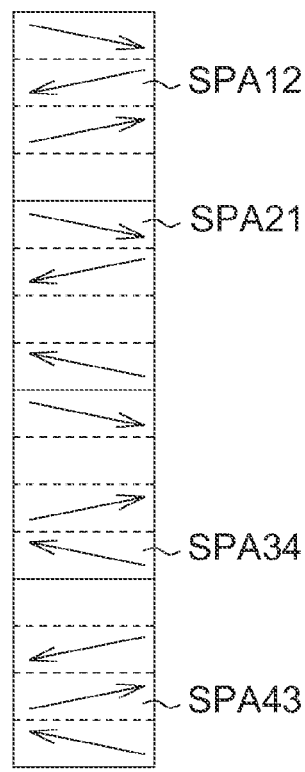

As illustrated in FIG. 9A, in the third exposure, in a first exposure, in the course when the photosensitive polymer material 120 sequentially passes through the first exposure unit MA31 and the second exposure unit MA32 of the third mask MA3, the photosensitive polymer material 120 is irradiated with a first exposure light L1 and a second exposure light L2 respectively passing through the first exposure unit MA31 (FIG. 9B) and the second exposure unit MA32 (FIG. 9B) to form a plurality of alignment portions with different alignment directions in one single sub-pixel area (an alignment portion is not yet formed thereon) of each of the first pixel area SPA1, the second pixel area SPA2, the third pixel area SPA3 and the fourth pixel area SPA4. In the present embodiment of the invention, with the use of a polarizer (not illustrated), the first exposure light L1 forms two lights with different polarization directions. The two lights respectively irradiate the first exposure sub-unit MA31$a$ and the second exposure sub-unit MA31$b$ of the first exposure unit MA31 to form two alignment portions with different alignment directions in the fourth sub-pixel area SPA14 of the first pixel area SPA1 and the third sub-pixel area SPA43 of the fourth pixel area SPA4 as illustrated in FIG. 9B. Similarly, with the use of a polarizer, the second exposure light L2 forms two lights with different polarization directions. The two light respectively irradiate the first exposure sub-unit MA32$a$ and the second exposure sub-unit MA32$b$ of the second exposure unit MA32 to form two alignment portions with different alignment directions in the second sub-pixel area SPA12 of the first pixel area SPA1 and the fourth sub-pixel area SPA34 of the third pixel area SPA3 as illustrated in FIG. 9B. In the present embodiment of the invention, the alignment portions formed in the fourth sub-pixel area SPA14, the third sub-pixel area SPA43, the second sub-pixel area SPA12 and the fourth sub-pixel area SPA34 have different alignment directions.

Figure 10A:
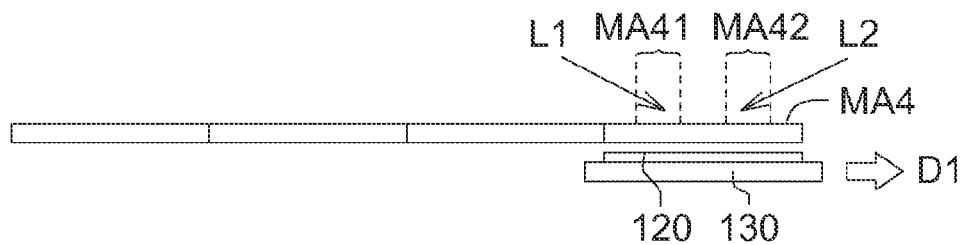
Figure 10B:
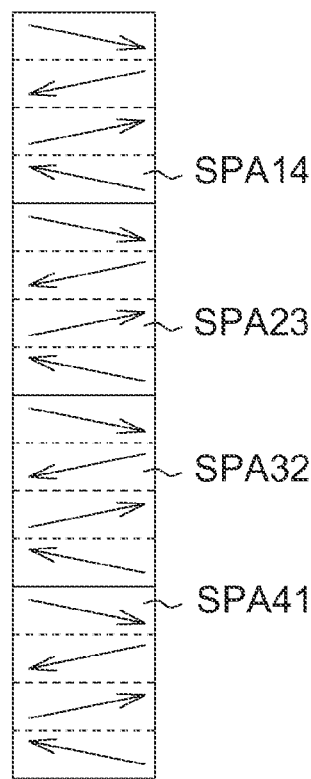

As illustrated in FIG. 10A, in a fourth exposure, in the course when the photosensitive polymer material 120 sequentially passes through the first exposure unit MA41 and the second exposure unit MA42 of the fourth mask MA4, the photosensitive polymer material 120 is irradiated with a first exposure light L1 and a second exposure light L2 respectively passing through the first exposure unit MA41 (FIG. 10B) and the second exposure unit MA42 (FIG. 10B) to form a plurality of alignment portions with different alignment directions in one single sub-pixel area (an alignment portion is not yet formed thereon) of each of the first pixel area SPA1, the second pixel area SPA2, the third pixel area SPA3 and the fourth pixel area SPA4. In the present embodiment of the invention, with the use of a polarizer, the first exposure light L1 forms two lights with different polarization directions. The two lights respectively irradiate the first exposure sub-unit MA41$a$ and the second exposure sub-unit MA41$b$ of the first exposure unit MA41 to form two alignment portions with different alignment directions in the third sub-pixel area SPA23 of the second pixel area SPA2 and the first sub-pixel area SPA41 of the fourth pixel area SPA4 as illustrated in FIG. 10B. Similarly, with a polarizer, the second exposure light L2 forms two lights with different polarization directions. The two light respectively irradiate the first exposure sub-unit MA42$a$ and the second exposure sub-unit MA42$b$ of the second exposure unit MA42 to form two alignment portions with different alignment directions in the fourth sub-pixel area SPA14 of the first pixel area SPA1 and the second sub-pixel area SPA32 of the third pixel area SPA3 as illustrated in FIG. 10B. In the present embodiment of the invention, the alignment portions formed in the third sub-pixel area SPA23, the first sub-pixel area SPA41, the fourth sub-pixel area SPA14 and the second sub-pixel area SPA32 have different alignment directions.

In the above embodiments, N=2 and M=2 are used as an exemplification. After each exposure, a sub-pixel area (an alignment portion is not yet formed thereon) of the first pixel area SPA1, a sub-pixel area (an alignment portion is not yet formed thereon) of the second pixel area SPA2, a sub-pixel area (an alignment portion is not yet formed thereon) of the third pixel area SPA3 and a sub-pixel area (an alignment portion is not yet formed thereon) of the fourth pixel area SPA4 form alignment portions with different alignment directions. Thus, after four times of exposure (N×M=4), all sub-pixel areas of each pixel area form different alignment portions with different alignment directions. Thus, each pixel area of the photosensitive polymer material 120 makes the display panel using the same become a display panel with multi-dimensional display domain.

In the disclosed embodiments, the photosensitive polymer material 120 sequentially passes through the first mask MA1 and the second mask MA2, the third mask MA3 and the fourth mask MA4. In another embodiment, the photosensitive polymer material 120 may sequentially pass through the first mask MA1, the second mask MA2, the third mask MA3 and the fourth mask MA4 in any order.

According to the method of forming an alignment film disclosed in above embodiments of the invention, in one exposing process, an alignment portion is formed in one sub-pixel area of each pixel area, so that both the fabrication time and production cost are reduced. In addition, the photosensitive polymer material may pass through all masks to complete the alignment operation without being rotated.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming an alignment film, comprising:
providing a photosensitive polymer material, wherein the photosensitive polymer material defines a first pixel area and a second pixel area each defining a first sub-pixel area and a second sub-pixel area;
in a first exposure, irradiating the photosensitive polymer material with a first exposure light and a second exposure light to form a first alignment portion and a second alignment portion in the first sub-pixel area of the first pixel area and the second sub-pixel area of the second pixel area respectively, wherein the alignment direction of the first alignment portion is different from that of the second alignment portion;
in a second exposure, irradiating the photosensitive polymer material with the first exposure light and the second exposure light to form a third alignment portion and a fourth alignment portion in the second sub-pixel area of the first pixel area and the first sub-pixel area of the second pixel area respectively, wherein the alignment direction of the third alignment portion is different from that of the fourth alignment portion.

2. The formation method according to claim 1, further comprising:
providing a first mask and a second mask, wherein the first mask and the second mask each having a first exposure unit and a second exposure unit;
in the step of the first exposure, irradiating the first exposure unit and the second exposure unit of the first mask with the first exposure light and the second exposure light respectively; and
in the step of the second exposure, irradiating the first exposure unit and the second exposure unit of the second mask with the first exposure light and the second exposure light respectively.

3. The formation method according to claim 2, further comprising:
driving the photosensitive polymer material to move along a moving direction and pass through the first mask and the second mask;
wherein, the first exposure unit and the second exposure unit of the first mask are separated by a distance along the moving direction, and the first exposure unit and the second exposure unit of the second mask are separated by a distance along the moving direction.

4. The formation method according to claim 3, wherein the first exposure unit and the second exposure unit of the first mask are separated by a distance along a direction perpendicular to the moving direction, and the first exposure unit and the second exposure unit of the second mask are separated by a distance along a direction perpendicular to the moving direction.

5. The formation method according to claim 1, wherein the alignment direction of the first alignment portion and that of the second alignment portion are differentiated by 180°.

6. The formation method according to claim 1, wherein the alignment direction of the third alignment portion and that of the fourth alignment portion are differentiated by 180°.

7. A method of forming an alignment film, comprising:
providing a photosensitive polymer material, wherein the photosensitive polymer material defines N×M pixel areas each defining N×M sub-pixel areas;
in each of the N×M times of exposure, irradiating the photosensitive polymer material with M different exposure lights to form a plurality of alignment portions with different alignment directions in one sub-pixel area of each of the N×M pixel areas, wherein N denotes the number of polarization orientation of each of the M exposure lights.

8. The formation method according to claim 7, further comprising:
providing N×M masks each having M exposure units;
in the step of irradiating the photosensitive polymer material with the M different exposure lights in each of the N×M times of exposure, the M exposure units are irradiated with the M exposure lights respectively.

9. The formation method according to claim 8, further comprising:
driving the photosensitive polymer material to move along a moving direction to pass through the N×M masks;
wherein, the M exposure unit are separated by a distance along the moving direction.

10. The formation method according to claim 9, wherein the M exposure units are separated by a distance along a direction perpendicular to the moving direction.

11. The formation method according to claim 9, wherein the P-th exposure light irradiates the N exposure sub-units of the P-th exposure unit to form N alignment portions with different alignment directions, wherein P is a positive integral between 1 and M.

12. The formation method according to claim 8, wherein each of the M exposure units of one of the N×M masks has N exposure sub-units, and the N×M exposure sub-units correspond to the N×M pixel areas.

* * * * *